US012694167B2

(12) United States Patent
Morrow et al.

(10) Patent No.:  US 12,694,167 B2
(45) Date of Patent:    Jul. 28, 2026

(54) SYSTEMS, METHODS, AND MEDIA FOR AUTOMATICALLY TRANSFORMING TEXTUAL DATA, REPRESENTING AN IMAGE, INTO P AND ID COMPONENTS

(71) Applicant: Bentley Systems, Incorporated, Exton, PA (US)

(72) Inventors: Stephen Morrow, Cedar Park, TX (US); Salman Abeed, Chester Springs, PA (US); Qarib Raza Kazmi, Rawalpindi (PK)

(73) Assignee: Bentley Systems, Incorporated, Exton, PA (US)

( * ) Notice:   Subject to any disclaimer, the term of this patent is extended or adjusted under 35 U.S.C. 154(b) by 933 days.

(21) Appl. No.: 17/982,731

(22) Filed:   Nov. 8, 2022

(65)              Prior Publication Data

US 2024/0152661 A1     May 9, 2024

(51) Int. Cl.
*G06F 30/13*           (2020.01)
(52) U.S. Cl.
CPC .................................... *G06F 30/13* (2020.01)
(58) Field of Classification Search
CPC ....................................................... G06F 30/13
See application file for complete search history.

(56)                References Cited

U.S. PATENT DOCUMENTS

| | | | | |
|---|---|---|---|---|
| 10,635,945 B2 * | 4/2020 | Sinha | ................... | G06V 30/422 |
| 2020/0175211 A1 * | 6/2020 | Kang | ...................... | G06F 30/23 |
| 2020/0175372 A1 * | 6/2020 | Sharma | .............. | G06F 16/9035 |
| 2023/0028142 A1 * | 1/2023 | Reimann | .............. | G06F 40/279 |
| 2024/0419147 A1 * | 12/2024 | Matsuda | ........... | G05B 19/4097 |

OTHER PUBLICATIONS

International Search Report and Written Opinion mailed Feb. 21, 2024 for International Application No. PCT/US2023/036794 filed Nov. 2, 2023 for Bentley Systems, Incorporated, 15 pages.
(Continued)

*Primary Examiner* — Paul S Schwarzenberg
(74) *Attorney, Agent, or Firm* — Cesari and McKenna, LLP; Omar M. Wadhwa

(57)                ABSTRACT
Techniques are provided for automatically transforming textual data, representing an image, into P&ID components. In an embodiment, a text file may represent an image of a plant and include a plurality of image objects representing plant components. A text class identifier corresponding to each image object may be identified in the text file. An insertable P&ID component may be identified for each image object based on determining that the text class identifier is included in an application hierarchical data structure. An ordered insertion may be performed to insert each insertable P&ID component into a P&ID schematic drawing utilizing an ordered hierarchy. Additionally, P&ID data may be generated for each P&ID component inserted into the P&ID schematic drawing. As a result, a P&ID or intelligent P&ID is generated from textual data that represents an image that is simply a pictorial representation of a plant.

20 Claims, 6 Drawing Sheets

(56) References Cited

OTHER PUBLICATIONS

Kim Hyungki et al., "Deep-learning-based recognition of symbols and texts at an industrially applicable level from images of high-density piping and instrumentation diagrams", Expert Systems With Applications, Elsevier, Amsterdam, NL, vol. 183, Jun. 9, 2021, XP086757633, ISSN: 0957-4174, [Retrieved on Jun. 9, 2021] chapters 1, 5, 6; figures 1-17.

Kwon Soonjo et al., "Standardized exchange of plant equipment and materials data based on ISO 15926 methodology in nuclear power plants" Annnals of Nuclear Energy, vol. 118, Aug. 1, 2018, pp. 185-198, Retrieved from the Internet: URL: https://www.sciencedirect.com/science/article/pii/S0306454918301804/pdfft?md5=c8ac0a3ca45be43432b7db228f9a6ef7&pid=1-s2.0-s0306454918301804-main.pdf.> figures 1, 4.

Nenadic Kosa et al.: "Rendering of JSON-LD CIM profile using web components", 2016 IEEE 14th International Symposium on Intelligent Systems and Informatics (SISY), IEEE, Aug. 29, 2016, pp. 251-256, [retrieved on Oct. 19, 2016] chapter II.

Grangel-Gonzalez Irlan: "A Knowledge Graph Based Integration Approach for Industry 4.0", Nov. 29, 2018, pp. 1-198, Retrieved from the Internet: URL:https://d-nb.info/1188732234/34 [retrieved on Mar. 31, 2023] listing 2.1, p. 20, figure 2.5.

Sierla Seppo et al., "Integrating 2D and 3D Digital Plant Information Towards Automatic Generation of Digital Twins", 2020 IEEE 29th International Symposium on Industrial Electronics (ISIE), IEEE, Jun. 17, 2020, pp. 460-467, [retreived on Jul. 29, 2020] abstract, figures 1-13.

Paganus Niklas et al., "Automatic Generation of Dynamic Simulation Models Based on Standard Engineering Data", Proceedings of hte 9th Eurosim Congress on Modelling and Simulation, Eurosim 2016, the 57th SIMS Conference on Simulation and Modelling SIMS 2016, vol. 142, Dec. 19, 2018.

* cited by examiner

```
325 ─────{
305 ─────
310 ─────"id": "6z5qCW/KS",
            "iModelClass": "PUMP",
            "userLabel": "A-PMP-0001",
315 ─────  "properties": {
              "type": "pump",
              "description": "Horizontal Pump",
            },
            "points":[
320 ─────    {"x":960.0, "y":352.0},
              {"x":1009.0, "y":352.0},
              {"x":1009.0, "y":367.0},
              {"x":960.0, "y":367.0}
            ],
326 ─────  },
```

```
<ECClass typeName="EQUIPMENT" displayLabel="Equipment">
</ECClass>
<ECClass typeName="ROTATING_EQUIPMENT"
displayLabel="Rotating Equipment">
    <BaseClass>EQUIPMENT</BaseClass>
</ECClass>
<ECClass typeName="PUMP" displayLabel="Pump">
    <BaseClass>ROTATING_EQUIPMENT</BaseClass>
</ECClass>
```

FIG. 5

```
605 ——Key            =     "6z5qCW/KS"
610 ——ClassName      =      "PUMP"
630 ——Key            =     "A-PMP-0001"
615 {  Properties    =     [DESCRIPTION: "Horizontal
       Pump"]

620 {  Points        =     [HIGH.X: 1009.0, HIGH.Y:
       352.0, LOW.X: 960,   LOW.Y: 367.0]
625 ——Parent         =     NULL
635 ——AssociatedKeys =     ["COIVBTx6Q"] (Nozzle)
```

FIG. 6

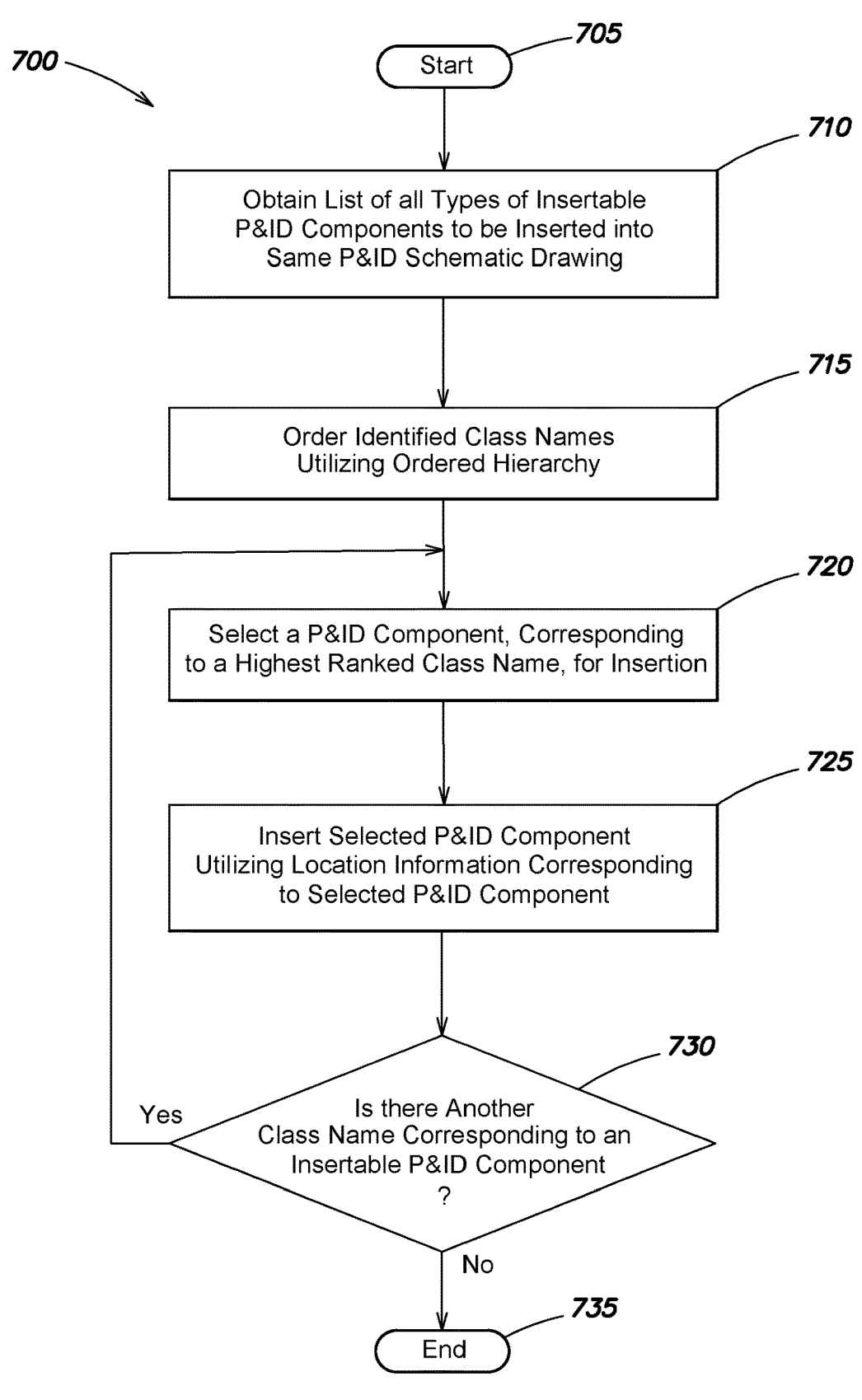

*700*

*705*

Start

*710*

Obtain List of all Types of Insertable
P&ID Components to be Inserted into
Same P&ID Schematic Drawing

*715*

Order Identified Class Names
Utilizing Ordered Hierarchy

*720*

Select a P&ID Component, Corresponding
to a Highest Ranked Class Name, for Insertion

*725*

Insert Selected P&ID Component
Utilizing Location Information Corresponding
to Selected P&ID Component

*730*

Yes

Is there Another
Class Name Corresponding to an
Insertable P&ID Component
?

No

*735*

End

FIG. 7

SYSTEMS, METHODS, AND MEDIA FOR AUTOMATICALLY TRANSFORMING TEXTUAL DATA, REPRESENTING AN IMAGE, INTO P AND ID COMPONENTS

BACKGROUND

Technical Field

The present disclosure relates generally to Piping and Instrumentation. Diagram (RUM, and more specifically to automatically transforming textual data, representing an image, into P&ID components.

Background Information

A number of engineering fields utilize functional drawings. A functional drawing is independent of size and shape, focusing instead oil process flow. In the field of plant maintenance and design, a common type of functional drawing is a Piping and Instrumentation Diagram (P&ID). P&IDs provide a detailed schematic representation of the connectivity/network between all equipment, fittings, pipes, valves, and instruments of the plant. A standard set of symbols may be utilized in a P&ID, for example, symbols based on International Society of Automation (ISA) standards.

P&IDs, often referred to as intelligent P&IDs, may be thought of as a combination of the schematic drawing of the plant and a concurrently maintained database that stores the data (i.e., metadata) for the components (e.g., equipment, pipes, values, instruments etc.) of the plant. For example, piping data for the pipes included in the schematic drawing may be stored in the database and linked to the graphical representations of the pipes in the schematic drawing. Such piping data may include, but is not limited to, size of the pipes, material types of the pipes, flow direction, pipeline numbers and pipe classes, blinds, flow lines, insulation and heat tracing, interconnection references, finish lines, etc.

When, for example, the P&ID, i.e., schematic, is modified, to include a new pump, the database may be automatically updated with data to reflect the modification. Additionally, and when the pump is inserted into a P&ID, the application hosting the P&ID may automatically require inlet and discharge sizes to be input so that the database can track the piping into and out of the pump. The same holds true for most inline equipment and devices such as valves, flow meters, etc. One advantage of intelligent P&IDs is that various lists and reports can be generated at any time from the database. For example, if a user wants a horsepower estimate, a motor report can be generated from the database tabulating each motor and it's corresponding rating.

In many instances a user may create or maintain a pictorial representation of a plant with a plurality of plant components. For example, the pictorial representation may be an image file (e.g., JPEG, PNG, bitmap, etc.). Unlike a P&ID, the image file is not linked to a corresponding database that stores characteristics information for each of the plant objects. Because the image file is only a pictorial representation of the plant, the user cannot obtain the same type of robust information (e.g., reports) that is available from a P&ID. For example, a user cannot determine from an image the simulation behavior of the pump, when the pump is to be replaced, how the plant would behave if the plant included a different pump, etc. Therefore, and to obtain information offered with a P&ID, the user has to create a P&ID, of the plant in a P&ID environment (e.g., P&ID application), from the image file. The user cannot simply use the existing image file in the P&ID environment. In many instances, the image of the plant may be very complex and include hundreds if not thousands of plant components. Creating a P&ID from such a complex image can lead to many errors, whether it be inserting a P&ID component incorrectly or utilizing incorrect P&ID data for an inserted component. Additionally, creating such a complex P&ID may also be very time consuming.

Accordingly, it may be advantageous to automatically transform an image file to P&IDs such that the user can have access to the robust information that is provided with the use of P&IDs and that is not available with the use of image files that are simply pictorial representations.

SUMMARY

Techniques are provided for automatically transforming textual data, representing an image, into P&ID components according to the one or more embodiments as described herein.

In an embodiment, a processor, e.g., a P&ID module executed by the processor, may obtain textual data (e.g., a text file) representing an image file of a plant (e.g., JPEG, PNG, bitmap, etc.) that includes image objects representing components of the plant. The processor may analyze the text file to identify a particular type of identifier for each of the image objects. In an embodiment, the particular type of identifier may be a text class identifier.

The processor may determine if the text class identifier, for each of the image objects, is included in an application hierarchical data structure maintained an application, e.g., P&ID application. If the text class identifier for a particular image object is not included in the application hierarchical data structure, the processor may determine that a P&ID component cannot be generated for the particular image object.

In response to determining that the text class identifier for particular image objects are included in the application hierarchical data structure, the process determine that a P&ID component can be utilized to represent the particular image objects in a P&ID. The processor may determine the P&ID component (e.g., P&ID pump component, P&ID nozzle component, P&ID furnace component) for each of the particular image objects based on the class names and base classes included in the application hierarchical data structure.

The processor may then perform an ordered insertion for the determined P&ID components, wherein the ordered insertion may indicate the order of insertion in a P&ID schematic drawing based on a types of the P&ID components. For example, P&ID equipment components may be inserted in a P&ID schematic drawing before &ID pipeline components are inserted in the P&ID schematic drawing. The processor may also generate P&ID data for each of the P&ID components inserted in the P&ID schematic drawing. The P&ID data may be stored in a database and linked to the P&ID schematic drawing.

As a result, a P&ID or intelligent P&ID for a plant is automatically generated from textual data that represents an image file that is imply a pictorial representation of the plant.

BRIEF DESCRIPTION OF THE DRAWINGS

The description below refers to the accompanying drawings, of which:

FIG. 3 is an illustrative example of textual data for the pump included in image of FIG. 2 according to the one or more embodiments as described herein;

FIG. 5 is an illustrative example of application hierarchical data structure according to the one or more embodiments as described herein;

FIG. 6 is example P&ID data for an insertable P&ID pump component, corresponding to the pump of FIG. 2, according to the one or more embodiments as described herein; and FIG. 7 is a flow diagram of a sequence of steps for performing an ordered insertion of a plurality of P&ID components according to the one or more embodiments as described herein.

DETAILED DESCRIPTION OF AN ILLUSTRATIVE EMBODIMENT

Figure 1:
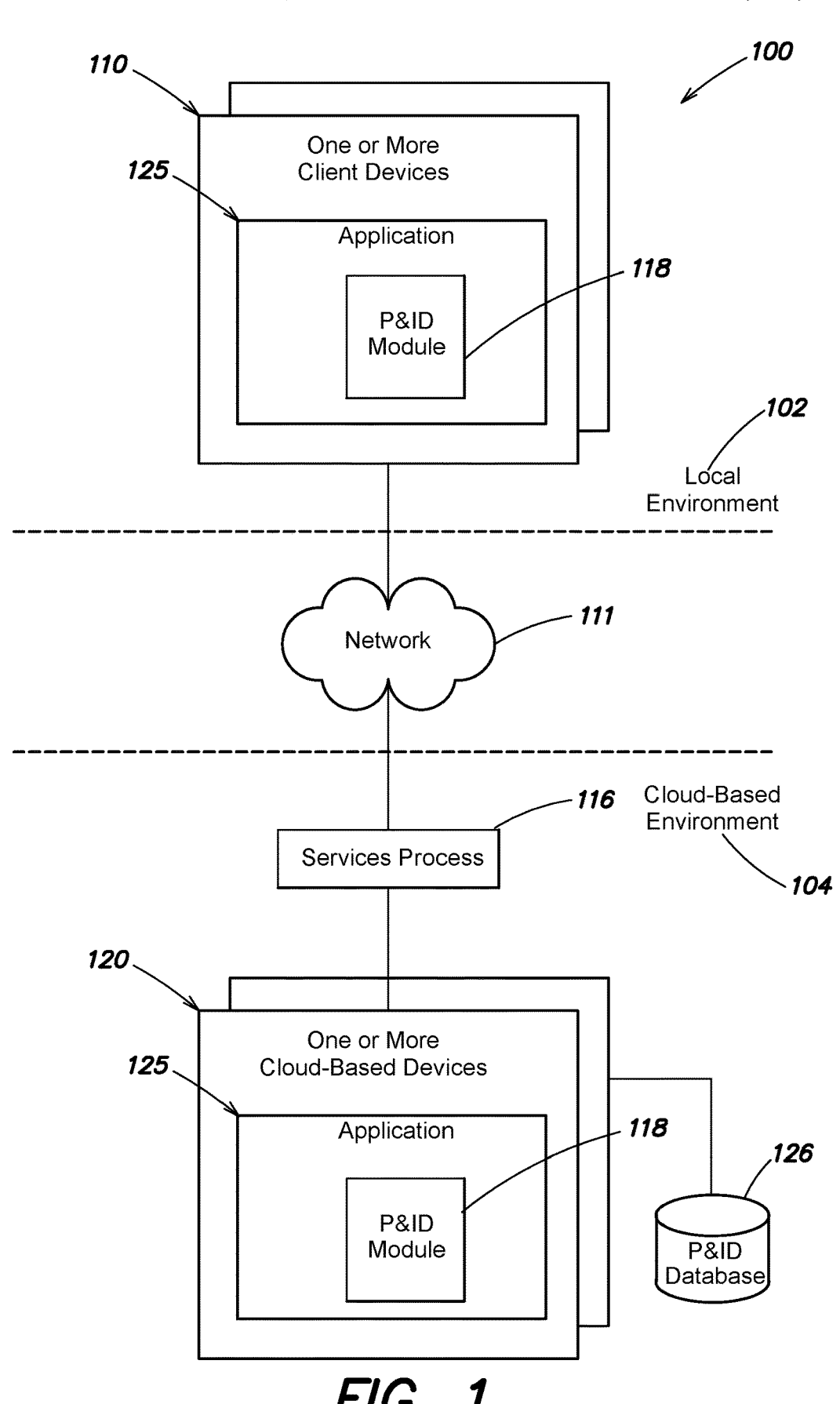
FIG. 1 is a high-level block diagram of an example architecture for automatically transforming textual data, representing an image, into P&ID components according to one or more embodiments described herein.

FIG. 1 is a high-level block diagram of an example architecture 100 for automatically transforming textual data, representing an image, into P&ID components according to one or more embodiments described herein. The architecture 100 may be divided into a local environment 102 that includes one or more local client devices 110 that are local to an end-user, and a cloud-based environment 104 that includes one or more cloud-based client devices 120 that are remote from the end-user and that are accessible to the end-user via a network 111 (e.g., the Internet). Each computing device, e.g., one or more local client devices 110 and one or more cloud-based client devices 120, may include processors, memory/storage, a display screen, and other hardware (not shown) for executing software/modules, storing data, and/or displaying information.

A local client device 110 may provide a variety of user interfaces and non-processing intensive functions. For example, a local client device 110 may provide a user interface, e.g., a graphical user interface and/or a command line interface, for receiving user input and displaying output according to the one or more embodiments described herein. A services process 116 may coordinate operation of the one or more local client devices 110 and the one or more cloud-based client devices 120 such that, for example, the one or more local client devices 110 may communicate with and access the one or more cloud-based client devices 120 via network 111.

The one or more client devices 110 and/or one or more cloud-based client devices 120 may store and execute application 125 that may automatically transform textual data, representing an image, into P&ID components according to the one or more embodiments as described herein and as will be described in further detail below. In an embodiment, the application 125 may be P&ID software configured to create, modify, and utilize P&IDs. At time, application 125 may be referred to as an application or a P&ID application. However, it should be understood that any application that provides P&ID functionality may be utilized with the one or more embodiments as described herein.

A P&ID or intelligent P&ID, as referred herein, may be a combination of a schematic diagram of a plant with one or more components and a corresponding database that stores data for each of the components (e.g., equipment, pipes, values, instruments, etc.) that are included in the schematic diagram. At times, the schematic diagram of the P&ID may be refereed to as the P&ID, however it is expressly contemplated that the P&ID for the plant includes both the schematic diagram and the corresponding database. In an embodiment, the application 125 may be the OpenPlant™ application available from Bentley Systems, Inc. In an embodiment, P&IDs, e.g., schematic drawing and data corresponding to each component in the schematic drawing, may be stored on database 126. In addition or alternatively, P&IDs may be stored in memory (not shown) or other storage (not shown) associated with client devices 110 and/or cloud-based client devices 120.

In an embodiment, the one or more local client devices 110 may download and store application 125 according to the one or more embodiments described herein. In an embodiment, the one or more local client devices 110 may utilize one or more user interfaces to access, via services process 116, the application 125 that is stored on the one or more cloud-based client devices 120 according to the one or more embodiments described herein.

The application 125 may include a P&ID module 118. The P&ID module 118 may automatically transform textual data, representing an image, into P&ID components according to the one or more embodiments as described herein. Specifically, and as will be described in further detail below, the P&ID module 118 may obtain textual data representing an image file of a plant (e.g., JPEG, PNG, bitmap, etc.) that includes image objects representing components of the plant. The P&ID module 118 may automatically transform the textual data into P&ID components for the image objects. Specifically, the automatic transformation may include determining an existing P&ID component for each of the objects in the image and performing an ordered insertion of the P&ID component into a P&ID schematic drawing. The automatic transformation may also include generating and storing P&ID data, in a corresponding database, for each of the inserted P&ID components. Therefore, the automatic transformation may result in generating a P&ID or intelligent P&ID from textual data representing an image file.

It is expressly contemplated that the P&ID module 118 may be hardware, software, or a combination thereof. In an embodiment, the processor (not shown) of a local client device 110 may be coupled to the memory (not shown) of the local client device 110, wherein the processor is configured to execute the decimation module. In addition or alternatively, the processor (not shown) of a cloud-based client device 120 may be coupled to the memory (not shown) of the cloud-based client device 120, wherein the processor is configured to execute the P&ID 118.

Figure 2:
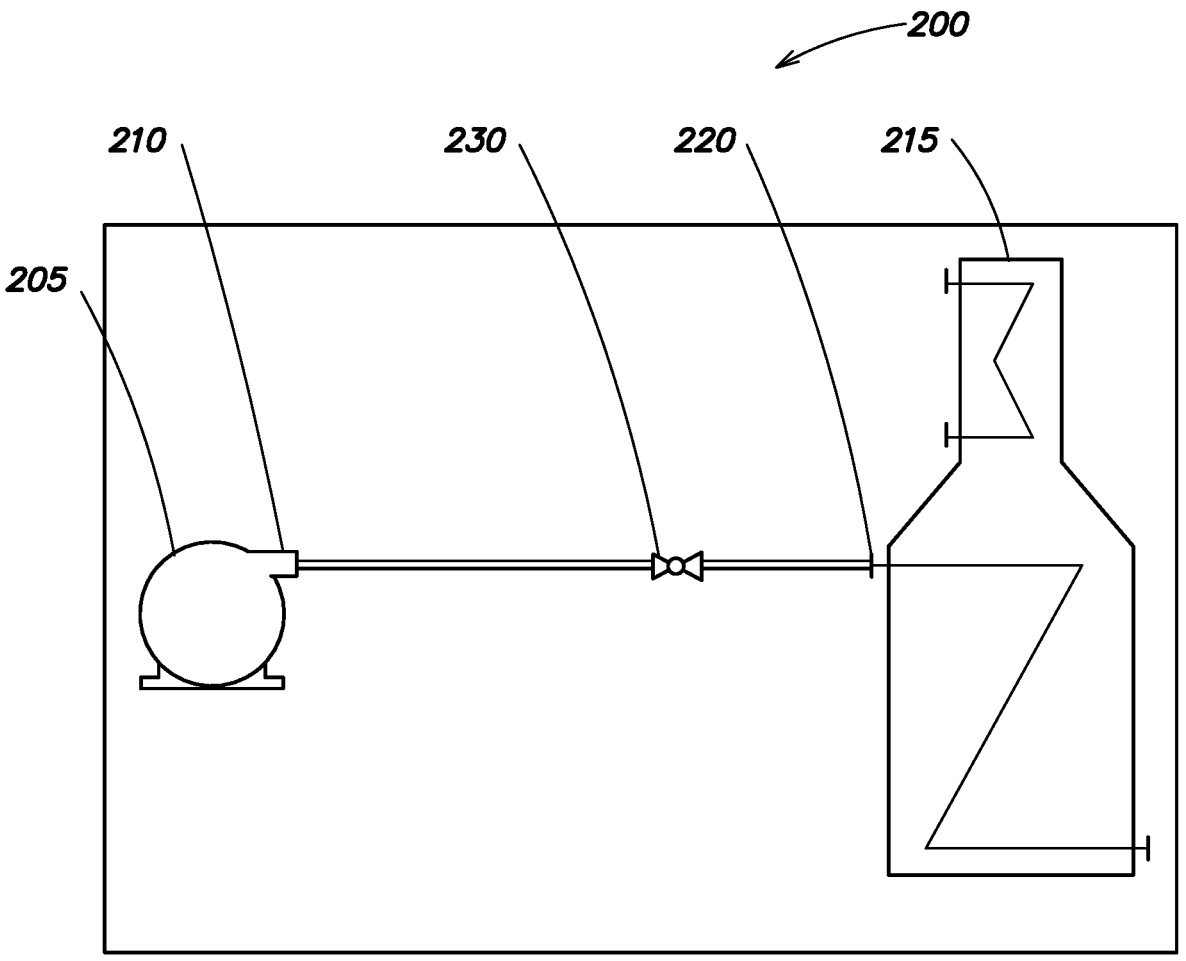
FIG. 2 is an illustrative example of an image of a plant including a plurality of objects (e.g., image objects) representing plant components according to the one or more embodiments as described herein.

FIG. 2 is an illustrative example of an image of a plant including a plurality of objects (e.g., image objects) representing plant components according to the one or more embodiments as described herein. As will be appreciated by those skilled in the art, image 200 is a simplified portion of a plant with only 5 plant components. However, it is expressly contemplated that the one or more embodiments as described herein are applicable to more complex plants with hundreds if not thousands of plant components. As such, image 200 of FIG. 2 is for illustrative purposes only.

In an embodiment, image 200 may be any type of file or object format. For example, image 200 may be a JPEG, PNG, bitmap, etc.

Image 200 includes pump 205 (equipment) with a nozzle 210 that is connected to furnace 215 (equipment) with a nozzle 220. Pipeline/piperun 225 of image 200 connects the pump 205 to the furnace 215 by way of valve 230 (gate). Image 200 of the plant is a pictorial representation of the plant without a corresponding database that stores information (e.g., characteristic information) for each of the objects included in image 200. Accordingly, image 200 is not equivalent to an P&ID (e.g., intelligent P&ID) and image 200 does not provide a user with the same type of robust information (e.g., reports) that are provided by P&IDs. In an embodiment, the image objects of FIG. 2 may be referred to as static entities or static objects. An image object of FIG. 2 is a static object because (1) the behavior and/or operation of the component represented by the image object cannot be simulated in the environment in which the image 200 is generated or utilized, and/or (2) the image object is not associated or linked with characteristic information that can be used to track, manage, modify, and/or retire the component represented by the image object.

As known by those skilled in the art, one or more artificial intelligence (AI) algorithms may be utilized to process an image file to generate textual data that represents the image. For example, the P&ID module 118 may utilize PnID to iTwin offered by Bentley Systems Inc. to process image 200 to generate textual data for the pump 205, nozzle 210, furnace 215, nozzle 220, pipeline/piperun 225, and valve 230.

FIG. 3 is an illustrative example of textual data 300 for the pump 205 included in image 200 of FIG. 2 according to the one or more embodiments as described herein. In an embodiment, textual data 300 may be stored in a JavaScript Object Notation (JSON) file or a different type of textual file or object. Textual data 300 includes an ID text line 305. ID text line 305 may be identified in textual data 300 by indicator "id". ID text line 305 may include an auto generated unique identifier for the pump 205. For example, an AI algorithm may process image 200 and generate a unique identifier, for pump 205 in image 200, that is included in ID text line 305 with the indicator "id". In the example of FIG. 3, ID text line 305 indicates that the unique identifier assigned to the pump 205 of image 200 is 6z5qCW/KS.

Textual data 300 may also include class text line 310. Class text line 310 may be identified by indicator "iModelClass" that indicates that class text line 310 includes a text class identifier. Class text line 310 also includes the text class identifier of PUMP. Therefore, class text line 310 indicates that the pump 205 of image 200 is of a PUMP class.

In an embodiment, and as will be described in further detail below, the text class identifier included in class text line 310 may be utilized by the P&ID module 118 to determine which existing P&ID component of the application 125 should be utilized to represent the pump 205 of FIG. 2 in the P&ID schematic drawing. For example, and as will be described in further detail below, the text class identifier of PUMP included in class text line 310 may be utilized to identify an existing P&ID pump component utilized by application 125. The P&ID pump component may be inserted in the P&ID schematic drawing such that the P&ID schematic drawing includes a P&ID component that corresponds to the pump 205 of FIG. 2. Additionally, and as will be described in further detail below, corresponding P&ID data may be generated for the inserted P&ID component, where the P&ID data may represent characteristics of the pump 205 of FIG. 2.

Textual data 300 may include properties text lines 315 and points text lines 320 for pump 205 of FIG. 2. Properties text lines 315 may be identified by indicator "properties" that indicates that properties text lines 315 store property information. Properties text lines 315 may include information describing the properties (e.g., type and description) of pump 205 of FIG. 2. In this example, the properties text lines 315 includes property information indicating that pump 205 of FIG. 2 is a pump and that pump 205 is a horizontal pump.

Points text lines 320 may be identified by indicator "points" that indicates that points text line 320 includes location information. Points text lines 320 may include information indicating a location of pump 205 in relation to the overall dimensions of the image 200. In this example, the location information included in points text lines 320 includes the x and y coordinates for the four corners of visual representation of the pump 205 in FIG. 2. In an embodiment, the center location or another predefined location on image 200 may be designated as the center of the coordinate system for image 200. It is expressly contemplated that textual data 300 may include additional information in addition to the text lines included in FIG. 3. For example, the textual data may include a user label that includes a label applied to the pump 205 in image 200.

For simplicity and ease of understanding, FIG. 3 only includes textual data 300 for pump 305 of image 200 of FIG. 2. However, it is expressly contemplated that the file storing the textual data representing image 200 would also include similar textual data for each of the other components (e.g., nozzle 210, furnace 215, nozzle 220, pipeline/piperun 225, and valve 230) included in image 200 of FIG. 2 according to the one or more embodiments as described herein. Further, and as known by those skilled in the art, a pipeline can consist of many piperuns, while a piperun can only belong to a single pipeline. For example, a single pipeline may consist of a plurality of piperuns that connect particular plant components. All the piperuns would belong to the same single pipeline. For the example of FIG. 2, and for simplicity, only a single pipeline and a single piperun exists between the pump 205 and furnace 215. As such, both the pipeline and piperun are identified with the same reference number of 225 (e.g., pipeline/piperun 225) in FIG. 2.

According to the one or more embodiments described herein, there may be textual data for a pipeline and separate textual data for each of the piperuns belonging to the pipeline. In the example of FIG. 2, there is textual data for the pipeline and also for the piperun between the pump 205 and furnace 215.

In an embodiment, the P&ID module 118 may utilize two outer defining syntactic constructs (e.g., delimiters) to determine that particular data in the textual data corresponds to the same object in image 200. For example, the P&ID module 118 may determine that because text lines 305 through text lines 320 are located between braces 325 and 326, the textual data included in text line 305 through text line 320 corresponds to the same object, e.g., pump 205, of FIG. 2.

According to one or more embodiments and as will be described in further detail below, the P&ID module 118 may automatically transform the textual data, representing image 200, to P&ID components. Further, and as will be described in further detail below, the P&ID module 118 may generate a P&ID corresponding to image 200 by (1) performing an ordered insertion of the P&ID components, corresponding to the objects included in image 200, into a P&ID schematic, and (2) populating a corresponding database with P&ID data for the inserted P&ID components. As such, the one or more embodiments as described herein can automatically generate a P&ID, e.g., an intelligible P&ID, from textual data representing an image file that is only a pictorial representation of a plant.

In an embodiment, a P&ID component represents a living asset, e.g., a real-world component, that is being utilized in a plant or that can be utilized in a plant. As such, the P&ID component has corresponding characteristic information (e.g., P&ID data) that describes the living asset, and some of this characteristic information can change over the lifecycle of the living asset. Therefore, the P&ID component can be used to track, manage, modify, and/or retire the living asset that is representing by the P&ID component. Additionally, application 125 can execute a P&ID including the P&ID component to simulate a behavior of the living asset represented by the P&ID component.

For example, let it be assumed that the living asset is a real-world pump that is being utilized in a plant or that can be utilized in a plant. Therefore, and in this example, the P&ID pump component would represent the real-world pump. Application 125 can execute a P&ID representing a plant that includes the P&ID component to simulate the behavior and/or operation of the real-world pump over time. The P&ID pump component may also include P&ID data. For example, the P&ID data may include, but is not limited to, manufacturer, Paint Code (e.g., 9× Green), Tag Number (e.g., A-PMP-001 . . . B-PMP-0001) (e.g., Gould), dry weight (e.g., 42.8 lb), total weight (e.g., 100 lb), model number, design pressure (230 lbf/in$^2$), operating pressure (200 lbf/in$^2$), diameter (e.g., 4.25 in), nominal diameter (e.g., 4 in), operating temperature (e.g., 250 rate (e.g., 1040 gal/min), fluid type (e.g., water), intel pressure (225 lbf/in$^2$), material body (316 SS), outlet pressure (200 lbf/in$^2$), vapour pressure (150 lbf/in$^2$), upper limit pressure (230 lbf/in$^2$), upper limit design temperature (e.g., 250° F.), Some of the P&ID data, such as-Paint code, Tag Number or Design State may change over the lifecycle of the real-world pump. As such, the P&ID pump component can be used to track, manage, modify and/or retire the real-world pump.

Accordingly, pump 205 of FIG. 2 is a static representation of a general pump, while a P&ID pump component represents a real-world pump, and the P&ID pump component includes characteristics of the real-word pump and can be executed to simulate a behavior/operation of the real-world pump.

Figure 4:
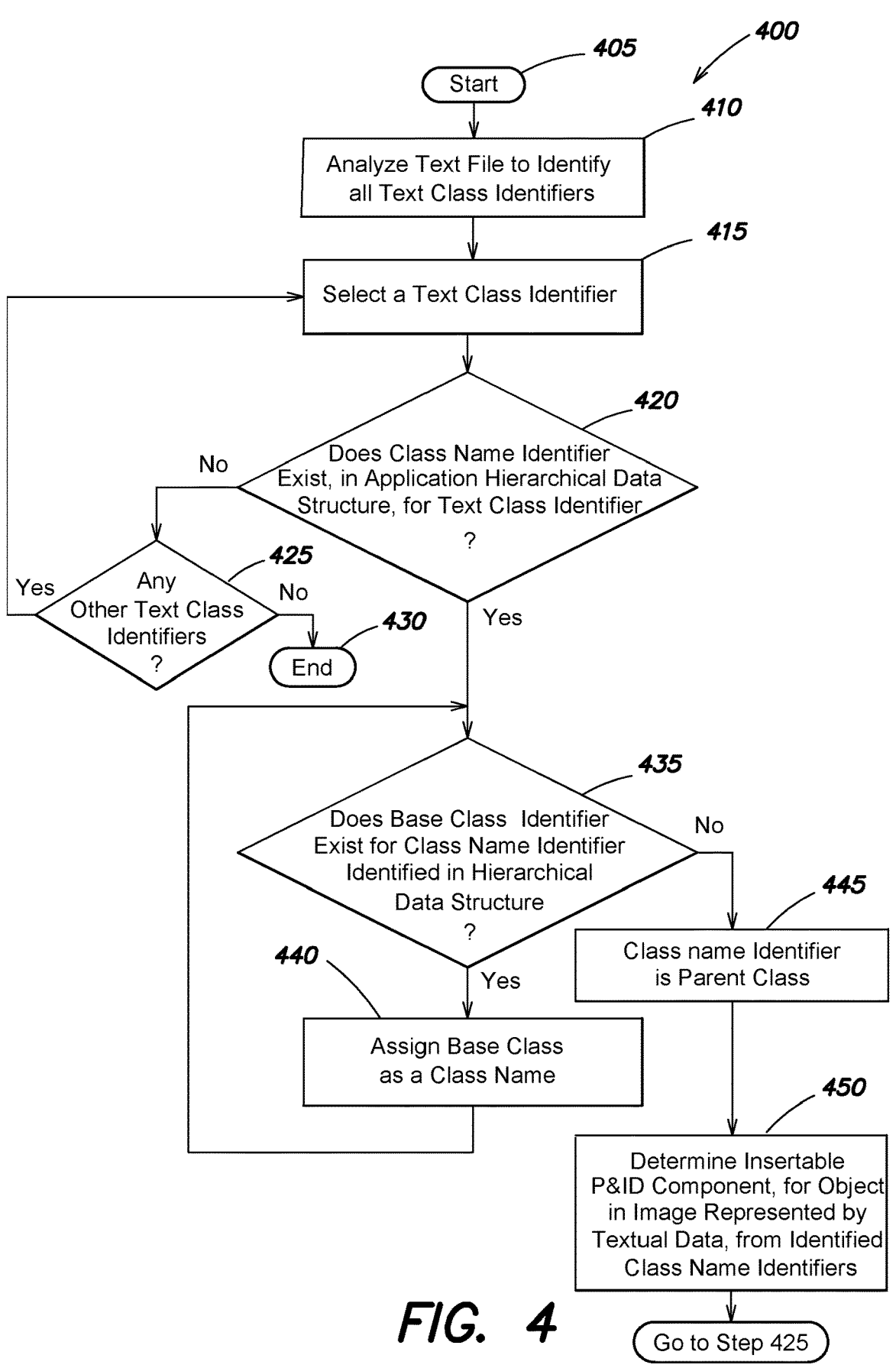
FIG. 4 is a flow diagram of a sequence of steps for automatically transforming textual data, representing an image, into an insertable P&ID components according to one or more embodiments described herein.

FIG. 4 is a flow diagram of a sequence of steps for automatically transforming textual data, representing an image, into an insertable P&ID components according to one or more embodiments described herein.

The procedure 400 starts at step 405 and continues to step 410 where the P&ID module 118 analyzes a text file to identify all text class identifiers in the text file. For this example, let it be assumed that the text file includes textual data for all components (e.g., pump 205, nozzle 210, furnace 215, nozzle 220, pipeline/piperun 225, and valve 230) included in image 200. The P&ID module 118 may semantically analyze, from top to bottom, the text file to identify the text class identifiers.

For example, the P&ID module 118 may semantically analyze the textual file to identify a text line that includes the text class identifier. In this example, iModelClass is the indicator that indicates which text lines include the text class identifier. Therefore, the P&ID module 118 may semantically analyze the text file and identify the indicator of iModelClass at class text line 310, e.g., text line 2, of text data 300 that is included in the text file. Based on the identification of iModelClass, the P&ID module 118 may determine that class text line 310 includes the text class identifier.

The P&ID module 118 may determine that the text string that follows the colon in class text line 310 is the text class identifier. As such, and in this example, the P&ID module 118 identifies the text class identifier of PUMP in class text line 310. In a similar manner, the P&ID module 118 may identify the text class identifiers for the other components (e.g., nozzle 210, furnace 215, nozzle 220, pipeline/piperun 225, and valve 230) represented in the text file.

The procedure continues to step 415 and the P&ID module 118 selects a text class identifier of all identified text class identifiers. In this example, let it be assumed that the P&ID module 118 selects the class identifier of PUMP that is identified at class text line 310.

The procedure continues to step 420 and the P&ID module 118 determines if a class name identifier exists, in an application hierarchical data structure associated with application 125 (e.g., P&ID application 125), for the text class identifier.

In an embodiment, the application hierarchical data structure may be maintained by the application 125 and include references to all P&ID components that can be included in or inserted into a P&ID schematic drawing that is generated and used with application 125. As such, the application hierarchical data structure may be dependent on the type of P&ID application 125 such that different applications have different corresponding application hierarchical data structures.

FIG. 5 is an illustrative example of an application hierarchical data structure 500 according to the one or more embodiments as described herein. For simplicity and ease of understanding, FIG. 5 only includes a portion of an application hierarchical data structure for a pump P&ID component. However, it is expressly contemplated that the application hierarchical data structure according to the one or more embodiments would include additional portions for all other P&ID components that may be inserted into a P&ID schematic drawing. In an embodiment, the application hierarchical data structure 500 may be in an XML format.

As depicted in FIG. 5, an application hierarchical data structure 500 may include a plurality of class indicators (e.g., class type name, base class, etc.) with corresponding information or identifiers. Continuing with the example, the text class identifier, identified in the text file representing image 200, is PUMP. As such, the P&ID module 118 may semantically analyze application hierarchical data structure 500 to determine if the text class identifier of PUMP is included in application hierarchical data structure 500. In this example, and based on the semantic analysis, the P&ID module 118 determines that PUMP is included at line 7 of application hierarchical data structure 500. Specifically, line 7 includes the identifier of PUMP and further includes a class name indicator of "ECClass TypeName". Therefore, the P&ID module 118 may determine that PUMP is a class name identifier. As such, and this example, the P&ID module 118 determines the class name identifier of PUMP exists, in application hierarchical data structure 500, for the text class identifier of PUMP of textual data 300.

If, however, the P&ID module 118 determines that a class name identifier does not exist in the application hierarchical data structure 500 for the text class identifier, the procedure continues to step 425. If a class name identifier does not exist, the P&ID module 118 determines that an insertable P&ID component does not exists for the object in the image that corresponds to the text class identifier identified in textual data 300. At step 425, the P&ID module 118 determines if there are any other text class identifiers that were identified in the text file. If so, the procedure reverts back to step 415. If not, the procedure ends at step 430.

Referring back to the example, the P&ID module 118, at step 420, determines that the class name identifier of PUMP exists in the application hierarchical data structure 500 for text class identifier of PUMP of textual data 300. As such, the procedure continues from step 420 to step 435. At step 435, the P&ID module 118 determines if a base class identifier exists for the class name identifier identified in the application hierarchical data structure 500.

For example, the P&ID module 118 may semantically analyze application hierarchical data structure 500 and determine that line 7 and line 8 are between two consecutive and corresponding delimiters, that, in this example, are </ECClass>. As such, the P&ID module 118 may determine that lines 7 and 8 of application hierarchical data structure 500 are related lines. Additionally, the P&ID module 108 may determine that line 8 includes a base class since line 8 includes a base class indicator of "BaseClass." Because lines 7 and 8 are related and line 8 includes a base class indicator, the P&ID module 118 may determine that a base class identifier exists for the class name identifier. In this example, the base class identifier at line 7 is ROTATING_EQUIP-MENT.

If, at step 435, it is determined that a base class identifier exists for class name identifier, the procedure continues to step 440. At step 440 the P&ID module 118 assigns the base class identifier as a class name identifier. In this example, the base class identifier at line 8 is ROTATING_EQUIPMENT. As such, the P&ID module 118 assigns ROTATING_EQUIPMENT as a class name identifier. The procedure then reverts back to step 435. For this example, the P&ID module 118 determines at step 435 that there is a base class identifier of EQUIPMENT at line 5 for the class name identifier of ROTATING_EQUIPMENT at line 4, and then assigns the base class identifier of EQUIPMENT as a class name identifier (at step 440). The procedure would again revert back to step 435, but then determine that there is no base class identifier for the class name identifier of EQUIPMENT at line 1 (at step 435). Therefore, the procedure recursively identifies all base classes until a base class identifier does not exists in the application hierarchical data structure 500 for a class name identifier.

When it is determined that no base class identifier exists at step 435, the procedure continues to step 445. At step 445, the P&ID module 118 determines that the class name identifier is a parent class. In this example, the P&ID module 118 determines that a base class identifier does not exist for the class name identifier of EQUIPMENT. As such, the P&ID module 118 determines that the class name identifier of EQUIPMENT is a parent class.

The procedure then continues to step 450 and the P&ID module 118 determines the insertable P&ID component, for the object in an image represented by the textual data, from the identified class names identifiers. The procedure then continues to step 425 to determine if there are any other text class identifiers of the text file. As such, the procedure 400 can determine the insertable P&ID components for each object of image 200. Specifically, the P&ID module 118 determines the insertable P&ID component, if one exists, for each of the pump 205, nozzle 210, furnace 215, nozzle 220, pipeline/piperun 225, and valve 230.

In this example, and as explained above, the P&ID module 118 first identifies the class name identifier of PUMP (at step 420). The P&ID module 118 then identifies the class name identifier of ROTATING_EQUIPMENT. Specifically, the base class identifier of ROTATING_EQUIPMENT is assigned as a class name identifier (at step 440), and then the base class identifier of EQUIPMENT is determined to exists for the class name identifier ROTATING_EQUIPMENT of (step 415). The P&ID module 118 then identifies the class name of EQUIPMENT. Specifically, the base class identifier of EQUIPMENT is assigned as a class name identifier (at step 440), and then it is determined that no base class identifier exists for the class name identifier of EQUIP-MENT. As a result, the P&ID module 118 determines that the insertable P&ID component is: PUMP->RO-TATING_EQUIPMENT->EQUIPMENT. In this example, PUMP is the species, ROTATING_EQUIPMENT is the genus, and EQUIPMENT is the family. Stated another way, the P&ID module determines that the insertable P&ID component, corresponding to pump 205 of FIG. 2, is a pump (species) that is a type of rotating equipment (genus), which is a type of equipment (family). Accordingly, the P&ID module 118 determines that a insertable P&ID pump component needs to be inserted into a P&ID schematic drawing to represent the pump 205 of FIG. 2.

As such, the procedure 400 can determine the insertable P&ID components for each object of image 200. Specifically, the P&ID module 118 determines the insertable P&ID component, if one exists, for each of the pump 205, nozzle 210, furnace 215, nozzle 220, pipeline/piperun 225, and valve 230.

To generate a complete P&ID component for each of the objects of image 200, the P&ID module 118 also generates P&ID data for each insertable P&ID component. In an embodiment, the P&ID data for an insertable P&ID component may include at least a unique identifier, a class name identifier, a P&ID unique identifier, property information, location information, a parent P&ID component identifier (if one exists), and a list of associated P&ID identifiers (if they exists).

FIG. 6 is example P&ID data 600 for an insertable P&ID pump component, corresponding to the pump 205 of FIG. 2, according to the one or more embodiments as described herein.

P&ID data 600 includes a P&ID key line 605. P&ID key line 605 may be identified by indicator "Key" that indicates that P&ID key line 605 includes a unique identifier for pump 205 of FIG. 2. The P&ID module 118 may obtain the unique identifier from ID text line 305 of textual data 300 and include the unique identifier in P&ID key line 605 as depicted in FIG. 6.

P&ID data 600 includes a P&ID class name line 610. P&ID class name line 610 may be identified by indicator "ClassName" that indicates that P&ID class name line 610 includes a class name for the insertable P&ID component determined as described above with reference to FIG. 4 and corresponding to pump 205 of FIG. 2. In this example, the P&ID module 118 determines that an insertable P&ID pump component corresponds to pump 205 of FIG. 2. As such, the P&ID module 118 may include PUMP, e.g., the determined species, in P&ID class name line 610.

P&ID data 600 includes a P&ID unique identifier line 630. P&ID unique identifier line 630 may be identified by indicator "Key" that indicates that &ID unique identifier line 630 includes the unique identifier assigned by application 125 for the insertable P&ID component corresponding to pump 205 of FIG. 2. In an embodiment, the P&ID module 118 may auto-generate the P&ID unique identifier. In this example, the P&ID unique identifier is A-PMP-0001. In an embodiment, the P&ID module 118 may differentiate the P&ID unique identifier from unique identifier of line 605 based on the formats of the identifiers. For example, the P&ID module 118 may determine that A-PMP-0001 is the P&ID unique identifier because it includes dashes, which are not included in line 605.

P&ID data 600 includes a P&ID properties line 615. P&ID properties line 615 may be identified by indicator "Properties" that indicates that P&ID properties line 615 includes the properties for the insertable P&ID component determined as described above with reference to FIG. 4 and corresponding to pump 205 of FIG. 2. In this example, the P&ID module 118 may obtain information from text properties lines 315 of textual data 300 that indicates that the pump 205 of FIG. 2 is a horizontal pump. As such, the P&ID module 118 may include horizontal pump in P&ID properties line 615.

P&ID data 600 includes a P&ID points lines 620. P&ID points line 620 may be identified by indicator "Points" that indicates that P&ID points line 615 includes location information for the insertable P&ID component. In an embodiment, the P&ID module 118 may first obtain the location information from text points lines 320 of textual data 300 that indicates the location of the pump 205 of FIG. 2 in relation to a center location of image 200. The P&ID module 118 may utilize the location information with relation to the overall size of image 200 to determine the location of the pump 200 of FIG. 2 in relationship to the overall size of the image 200. For example, each corner of image 200 may have a coordinate (e.g., x-coordinate and a y-coordinate). The P&ID module 118 may determine the location of the pump 200 with relation to these four corners and the center location.

The P&ID module 118 may then translate the locations of the pump 205 to P&ID locations that are based on the size, e.g., four corner locations, of the P&ID schematic drawing in which the insertable P&ID pump component is to be inserted. In the example of FIG. 6, the location of the pump 205 is translated into two P&ID coordinates as illustrated at P&ID points line 620. The Two P&ID coordinates indicate where in the P&ID schematic drawing the P&ID pump component is to be inserted to represent the pump of FIG. 2. Specifically, the determined location of the P&ID pump component in relation to the overall size of the P&ID schematic drawing is substantially similar to the location of pump 205 in relation to the overall size of image 200.

P&ID data 600 includes a P&ID parent line 625. P&ID parent line 625 may be identified by indicator "Parent" that indicates that the P&ID parent line 625 include a unique identifier for a parent P&ID component determined for the insertable P&ID component if a parent P&ID component exists. In an embodiment, a P&ID schematic drawing is configured from left to right and top to bottom. As such, an insertable P&ID component may have a parent P&ID component if the insertable P&ID component is connected to another P&ID component that is to the left of or on top of the insertable P&ID component. In this example, and as depicted in FIG. 2, the pump 205 of FIG. 2 does not have a parent since it is the most left object in image 200. As such, P&ID parent line 625 includes NULL that indicates that the insertable P&ID component for pump 205 of image 200 does not include a parent P&ID. As another example, the P&ID parent line 625 of the P&ID data, corresponding to the insertable P&ID nozzle component for nozzle 210, would include the unique identifier, e.g., 6z5qCW/KS, of pump 205.

P&ID data 600 includes a P&ID associated keys line 635. P&ID associate keys 635 may be identified by indicator "AssociatedKeys" that indicates the associated component (e.g., connected components) of the insertable P&ID component if such associated components exists. In this example, the pump 205 is connected to nozzle 210 of image 200. As such, the P&ID associated keys line 630 includes the unique identifier for nozzle 210, which, in this example, is COIVBTx6Q and may be obtained from text data for nozzle.

The P&ID module 118 may generate P&ID data for each of the other determined insertable P&ID components that corresponds to the nozzle 210, furnace 215, nozzle 220, pipeline/piperun 225 (e.g., P&ID data for each of the pipeline and the piperun), and valve 230 of image 200 of FIG. 2.

Therefore, the P&ID module 118 automatically transforms textual data representing pump 205 into a P&ID pump component. The P&ID pump component includes the P&ID pump component that is to be inserted into a P&ID schematic drawing in the manner as described below with reference to FIG. 7 and corresponding P&ID data 600 as described above with reference to FIG. 6.

Based on determining each insertable P&ID component and generating corresponding P&ID data for each insertable P&ID component, the P&ID module 118 may perform an ordered insertion of the insertable P&ID components into a P&ID schematic drawing. In an embodiment, the insertion of the P&ID components into a P&ID schematic drawing may have the following ordered hierarchy:

1. P&ID equipment components (e.g., P&ID pump component, P&ID furnace component).
      a. P&ID nozzle components
    2. P&ID pipeline components
      a. P&ID pipe segment components (e.g., P&ID piperun components)
    3. P&ID inline components (e.g., P&ID gate valve component)
    4. P&ID instrument components (e.g., P&ID Distributed digital instrument)
    5. All other P&ID components.

FIG. 7 is a flow diagram of a sequence of steps for performing an ordered insertion of a plurality of P&ID components according to the one or more embodiments as described herein. The procedure 700 starts at step 705 and continues to step 710 and the P&ID module 118 obtains a list of all types of insertable P&ID components that are to be inserted into the same P&ID schematic drawing. In an embodiment, the P&ID module 118 analyzes the P&ID data, e.g., P&ID data 600, for all of the P&ID components that correspond to the pump 205, nozzle 210, furnace 215, nozzle 220, pipeline/piperun 225, and valve 230 of image 200 of FIG. 2. For example, the P&ID module 118 identifies the P&ID class name line 610 for each insertable P&ID component corresponding to the pump 205, nozzle 210, furnace 215, nozzle 220, pipeline/piperun 225, and valve 230 of image 200 of FIG. 2. For the pump 205 of FIG. 2, the P&ID module 118 identifies P&ID class line 610 and determines that PUMP is the P&ID class name for the pump 205 of FIG. 2. The P&ID module 118 also determines the class names for the P&ID components corresponding to nozzle 210, furnace 215, nozzle 220, pipeline/piperun 225, and valve 230 of image 200 of FIG. 2.

The procedure continues to step 715 and the P&ID module 118 orders the identified class names utilizing an ordered hierarchy. In an embodiment, the identified class names are ordered utilizing the ordered hierarchy as indicated above. Based on the above ordered hierarchy, the class names for the insertable P&ID components are ordered as:

1. Class name of the P&ID pump component corresponding to pump 205 and class name of the P&ID furnace component corresponding to furnace 215
   a. Class name of the P&ID nozzle component corresponding to nozzle 210 and class name of the P&ID nozzle component corresponding to nozzle 220
2. Class name of the P&ID pipeline component corresponding to pipeline/piperun 225
   a. Class name for the P&ID piperun component corresponding to pipeline/piperun 225
3. Class name for the P&ID gate valve component corresponding to valve 230

The procedure continues to step 720 and the P&ID module 118 selects an insertable P&ID component, corresponding to a highest ranked class name, for insertion into the P&ID schematic drawing. For this example, and based on the ordered hierarchy, the P&ID module 118 selects the P&ID pump component corresponding to pump 205 or the P&ID furnace component corresponding to furnace 215. In an implementation, the P&ID module may utilize any algorithm or technique to select a particular P&ID components of a plurality of P&ID components that are ranked at the same level of the ordered hierarchy. In this example, let it be assumed that the P&ID module 118 selects the P&ID pump component for insertion into the P&ID schematic drawing.

The procedure continues to step 725, and the P&ID module 118 inserts the selected P&ID component utilizing the location information corresponding to the selected P&ID component. In an embodiment, the location information is included at P&ID points line 620. Therefore, and in this example, the P&ID module 118 obtains the location information from P&ID points line 620 of P&ID data 600. The P&ID module 118 may utilize the location information to determine a particular location in the P&ID schematic drawing. The P&ID module 118 may then insert the P&ID pump component in the P&ID schematic drawing at the particular location.

The procedure then continues to step 730 and the P&ID module 118 determines if another class name corresponding to an insertable P&ID component. If not, the procedure end at step 740. If there is another class name corresponding to an insertable P&ID component, the procedure reverts back to step 720. Therefore, the P&ID module 118 continuously inserts the P&ID components corresponding to the objects in image 200 based on the ordered hierarchy and the location information obtained from the P&ID data, e.g., P&ID data 600.

As such, the P&ID module 118 inserts into a P&ID schematic drawing the determined insertable P&ID components that corresponds to pump 205, nozzle 210, furnace 215, nozzle 220, pipeline/piperun 225, and valve 230 of image 200 of FIG. 2. Each of the inserted P&ID components may be linked to a database that stores the P&ID data generated for the component. Accordingly, the one or more embodiments as described herein generate a P&ID or intelligent P&ID (e.g., P&ID schematic drawing and corresponding database storing information for the P&ID components in the P&ID schematic drawing) from textual data representing image 200 that is only a pictorial representation of a plant.

By automatically generating a P&ID from textual data representing an image, the one or embodiments as described herein provide an improvement in the existing technology of P&ID software. Specifically, the P&ID that is automatically generated according to the one or more embodiments as described herein will include fewer errors when compared to a P&ID that is generated manually from an image file. Because fewer errors are generated, processing resources are conserved when different data or reports are generated. For example, if a request to generate a report is received, any modifications or latest revisions can be reflected in the report to give an accurate account of what is currently represented in the P&ID schematic drawing.

It should be understood that a wide variety of adaptations and modifications may be made to the techniques. For examples, the steps of the flow diagrams as described herein may be performed sequentially, in parallel, or in one or more varied orders. In general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A system comprising:
   a processor coupled to a memory, the processor configured to:
      obtain, by an application, textual data representing an image of a plant including a plurality of image objects each representing a different plant component;
         wherein the textual data includes a plurality of text identifiers, and each of the plurality of text identifiers corresponds to a different image object;
      determine a plurality of particular text identifiers, of the plurality of text identifiers, that are included in an application hierarchical data structure maintained by the application;
      identify an insertable Piping and Instrumentation Diagram (P&ID) component for each of the plurality of particular text identifiers;
      generate P&ID data for each of the insertable P&ID components, wherein the P&ID data for each of the insertable P&ID components is stored in a database; and
      perform an ordered insertion of the insertable P&ID components into a P&ID schematic drawing utilizing a predefined ordered hierarchy, wherein the P&ID schematic drawing is linked to the database to generate a P&ID representing the plant from the image.

2. The system of claim 1, wherein the ordered hierarchy ranks an insertion order for potential P&ID components as:
   (1) P&ID equipment components;
   (2) P&ID nozzle components;
   (3) P&ID pipeline components;
   (4) P&ID pipe segment components;
   (5) P&ID inline components;
   (6) P&ID instrument components; and
   (7) All other types of P&ID components.

3. The system of claim 1, wherein the processor is further configured to generate one or more reports from the P&ID, wherein the one or more report includes information regarding behaviors or characteristics of the different plant components.

4. They system of claim 1, wherein a particular insertable P&ID component is inserted into the P&ID schematic drawing at a particular P&ID location that substantially matches an image location of a particular image object, corresponding to the particular insertable P&ID component, in the image.

5. The system of claim 1, wherein the insertable P&ID component for each of the plurality of particular text identifiers is identified based on one or more class names and one or more base classes included in the application hierarchical data structure.

6. The system of claim 1, wherein the plurality of text identifiers of the textual data are text class identifiers.

7. The system of claim 1, wherein the processor, when determining a selected text identifier is included in the application hierarchical data structure, further configured to:
   determine that a class name indicator in the application hierarchical data structure references the selected text identifier.

8. A method comprising:
   obtaining, by an application executed by a processor, textual data representing an image of a plant including a plurality of image objects each representing a different plant component;
      wherein the textual data includes a plurality of text identifiers, and each of the plurality of text identifiers corresponds to a different image object;
   determining a plurality of particular text identifiers, of the plurality of text identifiers, that are included in an application hierarchical data structure maintained by the application;
   identifying an insertable Piping and Instrumentation Diagram (P&ID) component for each of the plurality of particular text identifiers;
   generating P&ID data for each of the insertable P&ID components, wherein the P&ID data for each of the insertable P&ID components is stored in a database; and
   performing an ordered insertion of the insertable P&ID components into a P&ID schematic drawing utilizing a predefined ordered hierarchy, wherein the P&ID schematic drawing is linked to the database to generate a P&ID representing the plant from the image.

9. The method of claim 8, wherein the ordered hierarchy ranks an insertion order for potential P&ID components as:
   (1) P&ID equipment components;
   (2) P&ID nozzle components;
   (3) P&ID pipeline components;
   (4) P&ID pipe segment components;
   (5) P&ID inline components;
   (6) P&ID instrument components; and
   (7) All other types of P&ID components.

10. The method of claim 8, further comprising generating one or more reports from the P&ID, wherein the one or more report includes information regarding behaviors or characteristics of the different plant components.

11. The method of claim 8, wherein a particular insertable P&ID component is inserted into the P&ID schematic drawing at a particular P&ID location that substantially matches an image location of a particular image object, corresponding to the particular insertable P&ID component, in the image.

12. The method of claim 8, wherein the insertable P&ID component for each of the plurality of particular text identifiers is identified based on one or more class names and one or more base classes included in the application hierarchical data structure.

13. The method of claim 8, wherein the plurality of text identifiers of the textual data are text class identifiers.

14. The method of claim 8, when determining a selected text identifier is included in the application hierarchical data structure, the method comprising:
   determine that a class name indicator in the application hierarchical data structure references the selected text identifier.

15. A non-transitory computer readable medium having software encoded thereon, the software when executed by one or more computing devices operable to:
   obtain textual data representing an image of a plant including a plurality of image objects each representing a different plant component;
      wherein the textual data includes a plurality of text identifiers, and each of the plurality of text identifiers corresponds to a different image object;
   determine a plurality of particular text identifiers, of the plurality of text identifiers, that are included in an application hierarchical data structure maintained by an application;
   identify an insertable Piping and Instrumentation Diagram (P&ID) component for each of the plurality of particular text identifiers;
   generate P&ID data for each of the insertable P&ID components, wherein the P&ID data for each of the insertable P&ID components is stored in a database; and
   perform an ordered insertion of the insertable P&ID components into a P&ID schematic drawing utilizing a predefined ordered hierarchy, wherein the P&ID schematic drawing is linked to the database to generate a P&ID representing the plant from the image.

16. The non-transitory computer readable medium of claim 15, wherein the ordered hierarchy ranks an insertion order for potential P&ID components as:
   (1) P&ID equipment components;
   (2) P&ID nozzle components;
   (3) P&ID pipeline components;
   (4) P&ID pipe segment components;
   (5) P&ID inline components;
   (6) P&ID instrument components; and
   (7) All other types of P&ID components.

17. The non-transitory computer readable medium of claim 15, the software when executed by the one or more computing devices further operable to generate one or more reports from the P&ID, wherein the one or more report includes information regarding behaviors or characteristics of the different plant components.

18. The non-transitory computer readable medium of claim 15, wherein a particular insertable P&ID component is inserted into the P&ID schematic drawing at a particular P&ID location that substantially matches an image location of a particular image object, corresponding to the particular insertable P&ID component, in the image.

19. The non-transitory computer readable medium of claim 15, wherein the insertable P&ID component for each of the plurality of particular text identifiers is identified based on one or more class names and one or more base classes included in the application hierarchical data structure.

20. The non-transitory computer readable medium of claim 15, wherein the plurality of text identifiers of the textual data are text class identifiers.

\* \* \* \* \*